US010121534B1

(12) United States Patent
Lee

(10) Patent No.: US 10,121,534 B1
(45) Date of Patent: Nov. 6, 2018

(54) INTEGRATED CIRCUIT WITH OVERDRIVEN AND UNDERDRIVEN PASS GATES

(71) Applicant: Altera Corporation, San Jose, CA (US)

(72) Inventor: Andy L. Lee, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/974,015

(22) Filed: Dec. 18, 2015

(51) Int. Cl.
*G11C 11/417* (2006.01)

(52) U.S. Cl.
CPC ................ *G11C 11/417* (2013.01)

(58) Field of Classification Search
CPC ...... G11C 11/417; G11C 11/41; G11C 11/413; G11C 11/416; G11C 11/419
USPC ........................................ 365/156
See application file for complete search history.

(56) References Cited

U.S. PATENT DOCUMENTS

| 5,122,846 | A | 6/1992 | Haken |
| 5,642,315 | A | 6/1997 | Yamaguchi |
| 5,801,551 | A | 9/1998 | Lin |
| 6,025,737 | A | 2/2000 | Patel et al. |
| 6,262,893 | B1 | 5/2001 | Cliff et al. |
| 6,335,893 | B1 | 1/2002 | Tanaka et al. |
| 6,366,224 | B2 | 4/2002 | Cliff et al. |
| 6,433,585 | B1 | 8/2002 | Patel et al. |
| 6,483,165 | B2 | 11/2002 | Ooishi et al. |
| 6,489,804 | B1 | 12/2002 | Burr |
| 6,519,191 | B1 | 2/2003 | Morishita |
| 6,643,162 | B2 | 11/2003 | Takeuchi et al. |
| 6,724,222 | B2 | 4/2004 | Patel et al. |
| 6,777,978 | B2 | 8/2004 | Hart et al. |
| 6,795,332 | B2 | 9/2004 | Yamaoka et al. |
| 6,882,205 | B2 | 4/2005 | Curran et al. |
| 6,897,679 | B2 | 5/2005 | Cliff et al. |
| 7,180,334 | B2 | 2/2007 | Starr |
| 7,266,028 | B1 | 9/2007 | Ghosh Dastidar |
| 7,276,932 | B2 | 10/2007 | Kuang et al. |
| 7,277,351 | B2 | 10/2007 | Liu et al. |
| 7,358,764 | B1 | 4/2008 | Chan et al. |
| 7,411,853 | B2 | 8/2008 | Liu et al. |
| 7,463,057 | B1 | 12/2008 | Rahim et al. |
| 7,547,947 | B2 | 6/2009 | Anderson et al. |
| 7,635,988 | B2 * | 12/2009 | Madurawe ............ G11C 11/412 326/101 |
| 7,639,557 | B1 * | 12/2009 | Chou ........................ G11C 8/16 365/189.011 |

(Continued)

OTHER PUBLICATIONS

Yanzhong Xu, U.S. Appl. No. 13/360,585, filed Jan. 27, 2012.
Lane, U.S. Appl. No. 14/087,493, filed Nov. 22, 2013.

*Primary Examiner* — Alexander Sofocleous
*Assistant Examiner* — Alfredo Bermudez Lozada

(57) ABSTRACT

In one embodiment, an integrated circuit includes a pass gate circuit and a memory element circuit. The pass gate circuit receives a user signal that toggles between a high voltage level and a low voltage level. The memory element circuit outputs a control signal to control the pass gate circuit. The control signal may be asserted to be greater than the high voltage level when activating the pass gate circuit or the control signal may be deasserted to be less than the low voltage level when deactivating the pass gate circuit. In addition to that, a method on how to operate the pass gate circuit is also provided.

20 Claims, 7 Drawing Sheets

(56) References Cited

U.S. PATENT DOCUMENTS

| | | | |
|---|---|---|---|
| 7,800,402 B1 | 9/2010 | Rahim et al. | |
| 8,072,237 B1 | 12/2011 | Rahim et al. | |
| 8,258,572 B2 * | 9/2012 | Liaw | H01L 27/0207 |
| | | | 257/327 |
| 8,633,731 B1 | 1/2014 | Rahim et al. | |
| 2005/0280437 A1 | 12/2005 | Lewis et al. | |
| 2007/0109017 A1 * | 5/2007 | Liu | H03K 19/1776 |
| | | | 326/41 |
| 2007/0109899 A1 | 5/2007 | Liu et al. | |
| 2007/0113106 A1 | 5/2007 | Liu et al. | |
| 2010/0148304 A1 | 6/2010 | Rahim et al. | |
| 2015/0381182 A1 * | 12/2015 | Lin | H03K 19/17752 |
| | | | 326/38 |

* cited by examiner

INTEGRATED CIRCUIT WITH OVERDRIVEN AND UNDERDRIVEN PASS GATES

BACKGROUND

Routing circuitry is utilized to transfer a signal from one circuit element to another circuit element within an integrated circuit. The routing circuitry may include a pass gate transistor that gates the signal transmission. The pass gate transistor is controlled by a control signal, which is stored within a configuration random-access memory (CRAM) cell.

Generally, a pass gate transistor is an n-channel transistor (i.e., n-channel metal oxide semiconductor (NMOS) transistor). An n-channel transistor exhibits better charge mobility and conductive characteristics than a p-channel transistor. It is generally desired that a gate terminal of an n-channel pass gate transistor receive a voltage greater than a voltage level of a data signal received at its source-drain terminal by at least one threshold voltage level (Vt) but less than a maximum voltage level allowed between any two transistor junctions (VMAX). Such voltage levels supplied to the gate terminal may overdrive the n-channel pass gate transistor.

In older semiconductor process technologies, the VMAX tends to be only slightly greater than the standard voltage level. Therefore, although the n-channel pass gate transistor can be overdriven, other optimizations to the pass gates are restricted. However, with newer semiconductor process technologies, the VMAX headroom is increased. This provides much more flexibility in terms of designing a pass gate circuit and more room for optimization.

SUMMARY

Embodiments described herein include an integrated circuit with underdriven and overdriven pass gate circuits and a method for operating the pass gate circuit. It should be appreciated that the embodiments can be implemented in numerous ways, such as a process, an apparatus, a system, a device, or a method. Several embodiments are described below.

In one embodiment, an integrated circuit includes a pass gate circuit and a memory element circuit. The pass gate circuit receives a user signal that toggles between a high voltage level and a low voltage level. The memory element circuit outputs a control signal to control the pass gate circuit. The control signal may be asserted to have a voltage level that is greater than the high voltage level when activating the pass gate circuit or the control signal may be deasserted to have a voltage level that may be less than the low voltage level when deactivating the pass gate circuit.

In another embodiment, an integrated circuit includes a memory element and a pass gate circuit. The memory element may output a control signal that toggles between first and second voltage levels. The pass gate circuit may receive the control signal and transmits a user signal that toggles between third and fourth voltage levels. In one embodiment, the third and fourth voltage levels are within a voltage range formed between the first and second voltage levels. In addition to that, a voltage difference between the third and fourth voltage levels is less than a voltage difference between the first and second voltage levels. The voltage differences between the first and third voltage levels and the second and fourth voltage levels is at least one transistor threshold voltage.

In an alternative embodiment, a method of operating a pass gate circuit having a gate terminal may include an operational step to transmit a data signal through the pass gate circuit in response to receiving an overdriven voltage signal at the gate terminal of the pass gate circuit. The method also includes an operational step to disable the pass gate circuit in response to receiving an underdriven voltage signal at the gate terminal of the pass gate circuit.

Further features of the invention, its nature and various advantages will be more apparent from the accompanying drawings and the following detailed description of the preferred embodiments.

DETAILED DESCRIPTION

The following embodiments include a pass gate circuit that could be underdriven and overdriven and a method for operating the pass gate circuit. It will be obvious, to one skilled in the art, that the present exemplary embodiments may be practiced without some or all of these specific details. In other instances, well-known operations have not been described in detail in order not to unnecessarily obscure the present embodiments.

Throughout this specification, when an element is referred to as being "connected" or "coupled" to another element, it may be directly connected or coupled to the other element or electrically connected or coupled to the other element with yet another element interposed between them.

Figure 1:
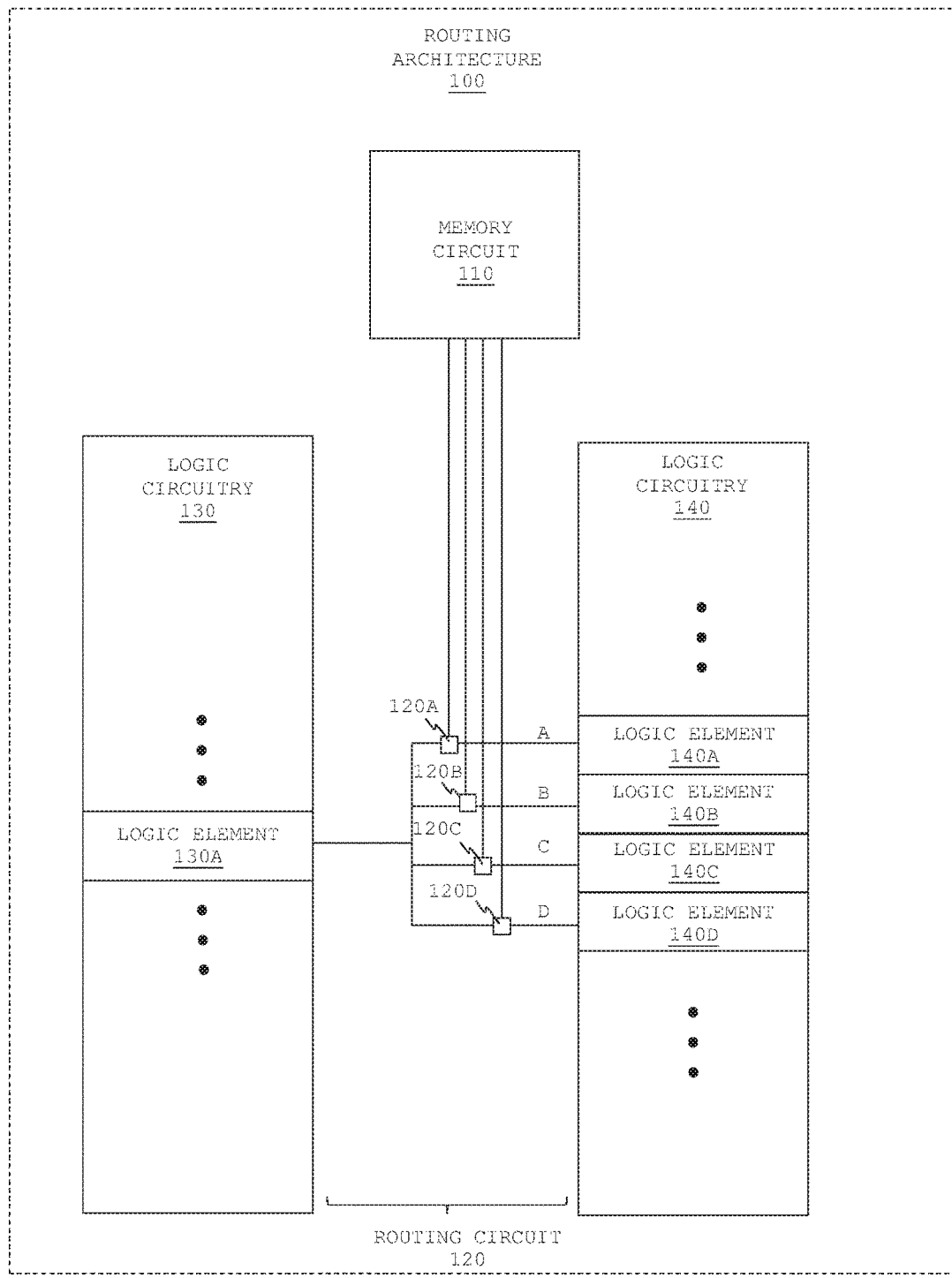
FIG. 1 shows an illustrative circuitry within an integrated circuit device in accordance with one embodiment of the present invention.

FIG. 1, meant to be illustrative and not limiting, illustrates circuitry within an integrated circuit device in accordance with one embodiment of the present invention. Circuitry 100 includes memory circuit 110, logic circuitry 130 and 140, and routing circuit 120.

In one embodiment, circuitry 100 shows the manner in which a signal (e.g., a data signal, a carry signal or a clock signal) may be transmitted from one circuit to another circuit. In the exemplary embodiment of FIG. 1, circuitry 100 shows how signals may be transmitted between logic circuitry 130 and logic circuitry 140 through routing circuit 120. The transmission of signals between logic circuitry 130 and 140 may be gated by pass gate circuits 120A, 120B, 120C and 120D. These pass gate circuits 120A, 120B, 120C and 120D are located at the respective routing interconnections A, B, C and D. These pass gate circuits 120A, 120B, 120C and 120D are controlled by memory elements (not shown) that are formed within memory circuit 110.

It should be appreciated that circuitry 100 may be a part of an integrated circuit device that could be an application specific integrated circuit (ASIC) device, an application specific standard product (ASSP) circuit device or a programmable logic device (PLD). Generally, the ASIC and ASSP devices perform fixed and dedicated functions whereas the PLDs are programmable to perform a variety of functions. An example of the PLD may be a field programmable gate array (FPGA) device. In one embodiment, circuitry 100 may be commonly found between two programmable logic elements within an FPGA device.

The integrated circuit device may be placed within a communication system, a processing system, etc. In one exemplary embodiment, the integrated circuit device is a part of the communication system that could be utilized to handle transmissions of data through a network server. Alternatively, the integrated circuit device may be a part of the processing system that could be utilized to perform high performance computing. The integrated circuit device may include multiple circuitries (e.g., processor circuitry and memory circuitry) that may interact with one another in addition to circuitry 100.

In the embodiment of FIG. 1, logic circuitry 130 and 140 may be utilized to perform core functions of the integrated circuit device. It should be appreciated that there may be more than two logic circuitry (i.e., logic circuitry 130 and 140) in most integrated circuit devices. In fact, for a PLD, logic circuitry (e.g., logic circuitry 130 and 140) may form the substantial portion of the circuitry.

Logic circuitry 130 and 140 includes multiple logic elements. Shown in the embodiment of FIG. 1, logic circuitry 130 includes logic element 130A whereas logic circuitry 140 includes logic element 140A, 140B, 140C and 140D. It should be appreciated that there may be multiple logic elements within each logic circuitry 130 and 140. For example, there may at least be eight logic elements within one logic circuitry.

Logic elements 130A, 140A, 140B, 140C and 140D may include circuits that are to be configured to perform functions that define the integrated circuit device. For example, each logic element 130A, 140A, 140B, 140C or 140D may include multiple multiplexer circuits, carry-chain adder circuits, etc. In addition to that, logic elements 130A, 140A, 140B, 140C and 140D may also include registers or other storage elements to store information.

These logic elements 130A, 140A, 140B, 140C and 140D may be interconnected through routing circuit 120. Routing circuit 120 includes multiple routing interconnects (e.g., routing interconnects A, B, C and D).

As shown in the embodiment of FIG. 1, one end of each of the routing interconnects A, B, C and D is coupled to a signal terminal at logic element 130A. The other end of each of the routing interconnects A, B, C and D is coupled to a signal terminal of a respective one of logic elements 140A, 140B, 140C and 140D. Therefore, a signal outputted from the signal terminal of logic element 130A is transmitted to the signal terminal of logic element 140A, 140B, 140C or 140D depending whether the signal is transmitted through the routing interconnect A, B, C or D (respectively), in one exemplary embodiment.

In one embodiment, these routing interconnects A, B, C and D may be utilized to transmit a signal (e.g., a data signal or a clock signal) from logic element 130A to one of the logic elements 140A, 140B, 140C and 140D. For example, routing interconnect A may be utilized to transmit a signal from logic element 130A to logic element 140A, routing interconnect B may be utilized to transmit a signal from logic element 130A to logic element 140B, and so on.

Alternatively, these routing interconnects A, B, C and D may be utilized to transmit a signal from logic element 130A to multiple logic elements 140A, 140B, 140C and 140D, in parallel. For example, the routing interconnects A and B may be utilized to transmit a signal from logic element 130A to logic elements 140A and 140B, in parallel.

Referring still to FIG. 1, routing interconnects A, B, C and D includes pass gate circuits 120A, 120B, 120C and 120D, respectively. Pass gate circuits 120A, 120B, 120C and 120D are utilized as gating components for the signals. These gating components may control the transmission of the signals through their respective routing interconnects A, B, C and D.

In one embodiment, pass gate circuits 120A, 120B, 120C and 120D may include only one transistor (a planar transistor or a non-planar transistor). In one exemplary embodiment, the one transistor may be an n-channel transistor (e.g., n-channel metal oxide semiconductor (NMOS) transistor) or a p-channel transistor (e.g., a p-channel metal oxide semiconductor (PMOS) transistor).

Alternatively, pass gate circuits 120A, 120B, 120C, and 120D may include multiple transistors (planar or non-planar transistors). The multiple transistors may form a complementary metal oxide semiconductor (CMOS) pass gate circuit (e.g., one p-channel transistor and one n-channel transistor coupled in parallel).

Referring still to FIG. 1, pass gate circuits 120A, 120B, 120C, and 120D may be similar types of circuits. For example, pass gate circuits 120A, 120B, 120C, and 120D may all be n-channel transistors or may all be p-channel transistors. Alternatively, pass gate circuits 120A, 120B, 120C, and 120D may be different types of circuits. For example, pass gate circuits 120A and 120B may be n-channel transistors whereas pass gate circuits 120C and 120D may be p-channel transistors. Additionally, each pass gate circuits 120A, 120B, 120C, and 120D may include one transistor or multiple transistors coupled in series. Pass gate circuits 120A, 120B, 120C, and 120D having multiple transistors coupled in series may be utilized to form hierarchical connectivity.

Each of these pass gate circuits 120A, 120B, 120C and 120D are controlled by the memory elements within memory circuit 110. As shown in the embodiment of FIG. 1, pass gate circuits 120A, 120B, 120C and 120D are coupled to memory circuit 110. In one embodiment, memory circuit 110 may be a static dynamic random access memory (SRAM) circuit. The memory elements within memory circuit 110 may be SRAM elements if memory circuit 110 is a SRAM circuit. It should be appreciated that memory circuit 110 may be referred to as a configuration random access memory (CRAM) when the integrated circuit device is an FPGA device. In one embodiment, each SRAM element may include six transistors (i.e., 6 Ts) or eight transistors (i.e., 8 Ts).

Memory circuit 110 may include information to control transmission of signals between logic elements within logic circuitry 130 and 140. Each of the memory elements within memory circuit 110 may be configured by a user through configuration software (e.g., Quartus II, Vivado, etc.). In one exemplary embodiment, the signals may be transmitted through routing interconnect A, B, C or D only if the respective memory element within memory circuit 110 activate the respective pass gate circuits 120A, 120B, 120C and 120D. In contrast, the signal may not be transmitted through routing interconnect A, B, C or D when its respective pass gate circuit 120A, 120B, 120C or 120D is deactivated.

Figure 2:
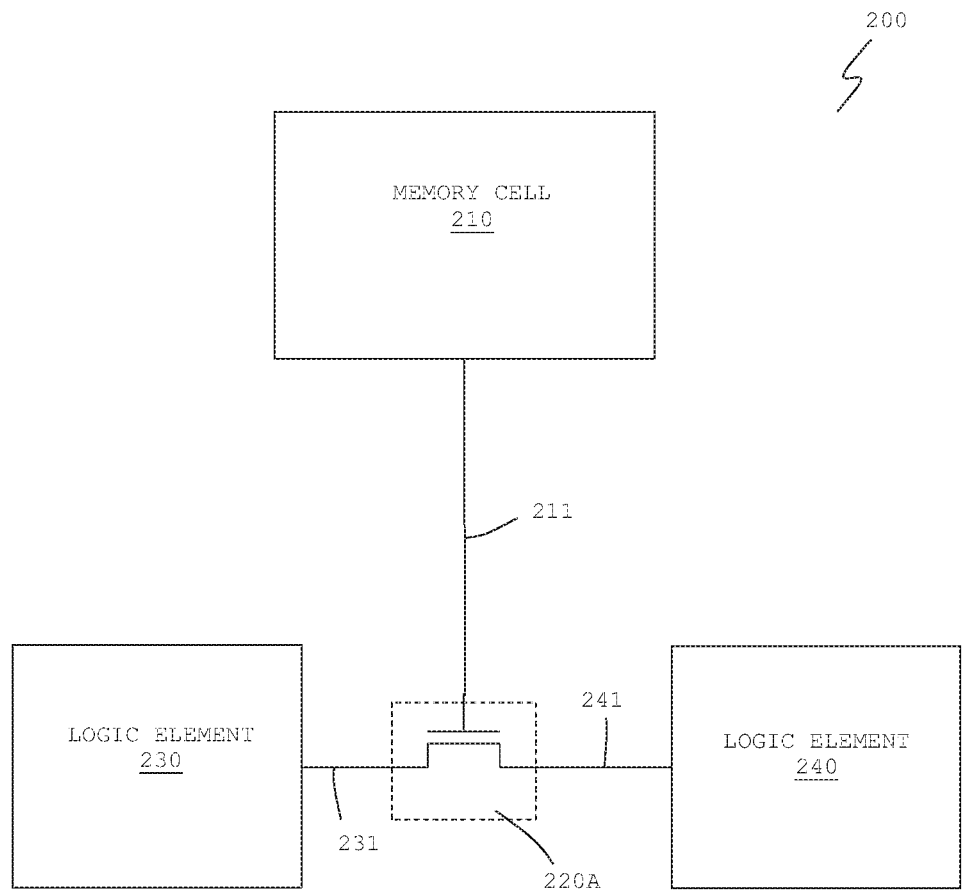
FIG. 2 shows an illustrative routing circuit architecture that is formed between two logic elements in accordance with one embodiment of the present invention.

FIG. 2, meant to be illustrative and not limiting, illustrates routing circuit architecture between two logic elements in accordance with one embodiment of the present invention. Routing circuit architecture 200 includes logic elements 230 and 240, memory cell 210 and pass gate circuit 220A.

In one embodiment, logic elements 230 and 240, memory cell 210 and pass gate circuit 220A may be similar to circuits within the embodiment of FIG. 1. For example, logic element 230 may be similar to logic element 130A, memory cell 210 may be similar to a memory cell within memory circuit 110, logic element 240 may be similar to logic element 140A, 140B, 140C or 140D, and pass gate circuit 220A may be similar to pass gate circuit 120A, 120B, 120C, or 120D. Therefore for the sake of brevity, the details of these circuits will not be repeated again.

As shown in the embodiment of FIG. 2, pass gate circuit 220A is an n-channel transistor. The n-channel transistor may be a planar structural transistor (e.g., an NMOS transistor) or a non-planar structure transistor (e.g., a multi-gate transistor, such as, fin-based field effect transistor (FinFET)).

Pass gate circuit 220A may be coupled to logic element 230, logic element 240 and memory cell 210 through routing interconnect 231, routing interconnect 241 and interconnect 211, respectively.

Similar to pass gate circuits 120A-120D of FIG. 1, pass gate circuit 220A may transmit signals between logic elements 230 and 240 when pass gate circuit 220A is activated and blocks transmission of any signals through the pass gate circuit 220A when pass gate circuit 220A is deactivated. The activation and deactivation of pass gate circuit 220A is controlled by memory element 210.

In the embodiment of FIG. 1, memory element 210 may supply a control signal that toggles between a logic high voltage (e.g., a logic '1') and a logic low voltage (e.g., a logic '0') via interconnect 211. In the embodiment of FIG. 2, the logic high voltage and logic low voltage may be utilized to activate and deactivate, respectively, pass gate circuit 220A. Pass gate circuit 220A may be placed in an overdriven condition when it is activated and in an underdriven condition when pass gate circuit 220A is deactivated. Hence, memory element 210 may also be said to provide an overdriven voltage level or an underdriven voltage level.

In one exemplary embodiment, the signal that is received at routing interconnects 231 and 241 may be toggling between two voltage levels (e.g., between 0.75 V and 0 V). An activation and deactivation voltage may be determined from the signal at routing interconnects 231 and 241. In this embodiment, the activation voltage for pass gate circuit 220A may be at 0.75 V whereas the deactivation voltage may be at 0 V.

In the embodiment of FIG. 2, pass gate circuit 220A may be supplied with an overdriven voltage level (e.g., 0.9 V) instead of the activation voltage level (e.g., 0.75 V) in order to place pass gate circuit 220A in to an overdriven condition. In addition to that, pass gate circuit 220A may be supplied with an underdriven voltage level (e.g., −0.15 V) instead of the deactivation voltage level (e.g., 0 V) in order to place the pass gate circuit 220A in to an underdriven condition.

It should be appreciated that the voltage differences between the overdriven voltage level and the underdriven voltage level may be less or equal to a predefined maximum voltage level (i.e., a VMAX). According to various embodiments, the VMAX may vary depending on a semiconductor process. For example, an advance semiconductor process, such as semiconductor process node that is utilized to form a transistor with a channel length of less than 20 nanometers (nm) may have a VMAX level of 1.05 V. The circuits that might be part of pass gate circuit 220A may have a reliability concern when it is supplied with voltage level differences of any greater than the VMAX level. In the exemplary embodiment above, the voltage level difference between the underdriven and overdriven voltage levels (e.g., 0.9 V and −0.15 V) is 1.05V, which is the VMAX level.

It should be appreciated that pass gate circuit 220A that is placed in an overdriven condition (that is when supplied with an overdrive voltage level) might be capable of transmitting a received signal with higher current drive, and thus higher performance compared to pass gate circuit 220A that is placed only in an activate condition (that is when supplied with an activation voltage level). In contrast, pass gate circuit 220A that is placed in an underdriven condition (that is when supplied with an underdriven voltage level) may have less current leakages compared to when pass gate circuit 220A is placed in a deactivated condition (that is when supplied with a deactivation voltage level).

In an alternative embodiment (not shown), pass gate circuit 220A may be a p-channel transistor (e.g., a PMOS transistor). In such embodiment, memory element 210 may supply a logic high signal to deactivate the pass gate circuit 220A and a logic low signal to activate pass gate circuit 220A. Pass gate circuit 220A may be supplied with an overdriven voltage level (e.g., −0.15 V) instead of the activation voltage level (e.g., 0 V) and may be supplied with an underdriven voltage level (e.g., 9 V) instead of the deactivation voltage level (e.g., 0.75 V).

In one embodiment, the overdriven voltage level may be different than an activation voltage of pass gate circuit 220A by at least a threshold voltage level (Vt). Similarly, the underdriven voltage level may be different than the deactivating voltage level by at least one threshold voltage level. The threshold voltage level for a transistor may be 0.15 V, in one exemplary embodiment.

Figure 3:
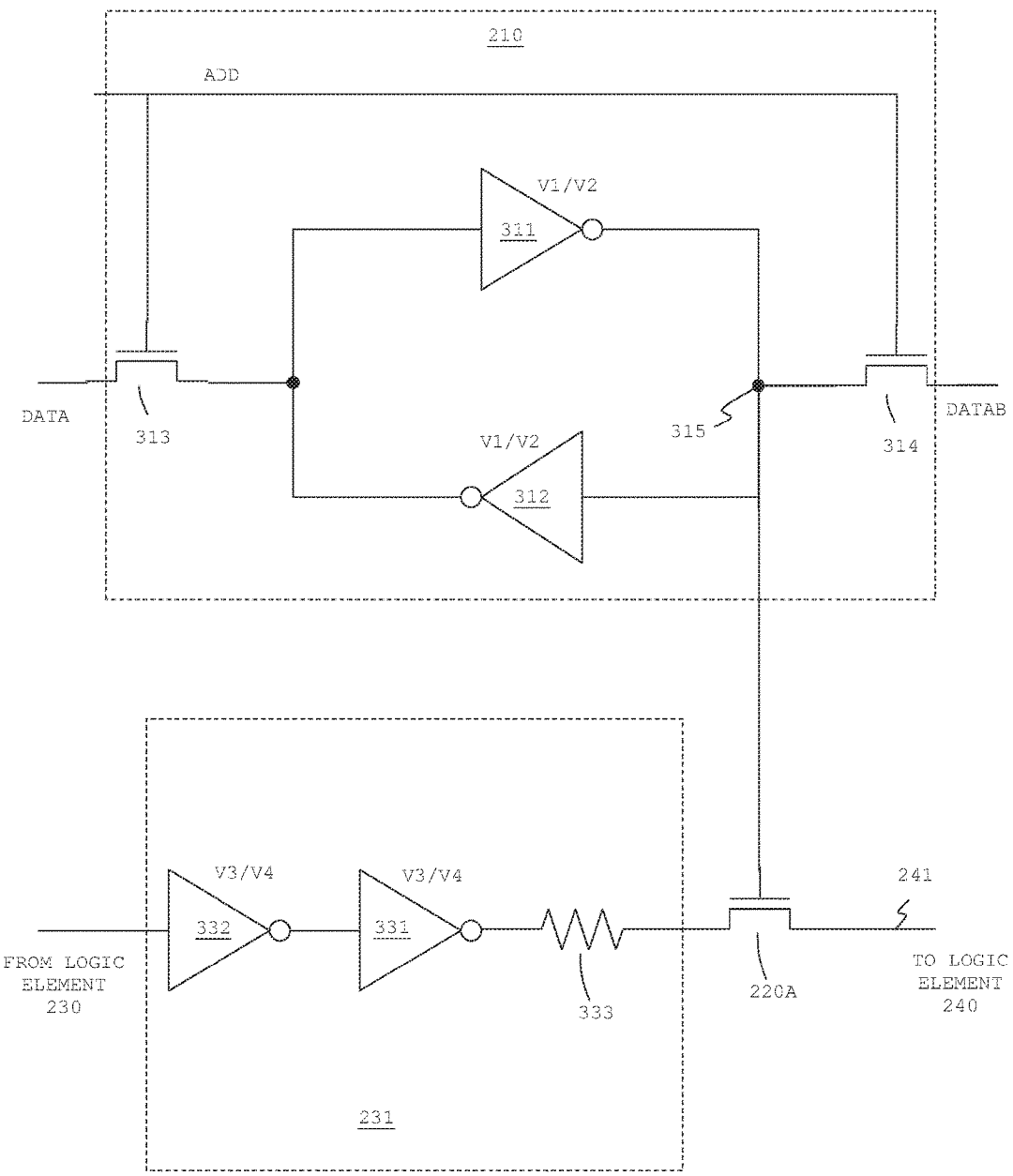
FIG. 3 shows a detailed implementation of an illustrative memory cell and routing interconnects of FIG. 2 in accordance with one embodiment of the present invention.

FIG. 3, meant to be illustrative and not limiting, illustrates a detailed implementation of the memory cell and the routing interconnect of FIG. 2 in accordance with one embodiment of the present invention. The details of memory cell 210, pass gate circuit 220A and routing interconnect 231 shown in FIG. 3 may be similar to memory element 210, pass gate circuit 220A and routing interconnect 231 of FIG. 2, respectively. Therefore, the details that were disclosed in FIG. 2 will not be repeated in here.

As shown in the embodiment of FIG. 3, memory element 210 is an SRAM element. Memory element 210 includes two cross-coupled inverters 311 and 312 and two n-channel transistors 313 and 314. Memory element 210 may form a part of CRAM, as described in FIG. 1. Memory element 210 may be coupled to n-channel transistor pass gate circuit 220A at terminal 315. Terminal 315 may be coupled to an output terminal of inverter 311, an input terminal of inverter 312 and a source-drain terminal of n-channel transistor 314.

Within memory element 210, each inverter 311 or 312 may be coupled to two power rails. The power rails may be at voltage levels V1 and V2. As an example, voltage V1 may be an overdriven voltage level, whereas voltage V2 may be an underdriven voltage level (e.g., the memory element may have a positive power supply terminal that receives overdriven voltage level V1 and a ground power supply terminal that receives underdriven voltage level V2). In one exemplary embodiment that is not intended to be limiting, the voltage levels V1 and V2 may be at 0.9 V and −0.15 V, respectively. Memory element 210 may control re-channel transistor pass gate circuit 220A by supplying one of the voltage levels (i.e., the voltage levels V1 or V2). The voltage levels V1 or V2 are supplied to the gate terminal of n-channel transistor pass gate circuit 220A (through terminal 315).

Referring still to FIG. 3, routing interconnect 231 includes two inverters 331 and 332 and resistor 333. Routing interconnect 231 couples logic element 230 to a source-drain terminal of n-channel transistor pass gate circuit 220A. A signal from logic element 230 may be transmitted through routing interconnect 231. In one embodiment, the signal may be a digital signal that toggles between be a logic low voltage level (i.e., logic '0') and a logic high voltage level (i.e., logic '1'). The logic low voltage level may be at a V3 voltage level and the logic high voltage level may be at V4 voltage level. In one exemplary embodiment that is not intended to be limiting provides that the voltage levels V3 and V4 to be at 0 V and 0.75 V, respectively.

A signal supplied by logic element 230 may reach the source-drain terminal of n-channel transistor pass gate circuit 220A after being transmitted through inverters 331 and 332. When n-channel transistor pass gate circuit 220A is in the overdriven condition, the signal may be transmitted through n-channel transistor pass gate circuit 220A to routing interconnect 241. However, when n-channel transistor pass gate circuit 220A is supplied with the underdriven condition, the signal may be blocked from getting transmitted through n-channel transistor pass gate circuit 220A to routing interconnect 241.

It should be appreciated that n-channel transistor pass gate circuit 220A is generally referred to a pass gate circuit having a standard NMOS transistor. The standard NMOS transistor may have a standard threshold voltage (Vt). In an alternative embodiment, n-channel transistor pass gate circuit 220A may include a low-threshold (low-Vt) n-channel transistor. The low-Vt n-channel transistor has a reduced threshold voltage compared to the standard Vt n-channel transistor with a shorter signal transition period and therefore it is fast in terms of transmitting a signal through n-channel transistor pass gate circuit 220A. However, the low-Vt n-channel transistor suffers from high leakages. A low-Vt n-channel transistor that forms part of n-channel transistor pass gate circuit 220A may have low static leakage currents when n-channel transistor pass gate circuit 220A is deactivated in an underdriven condition (e.g., using −0.15V).

Figure 4:
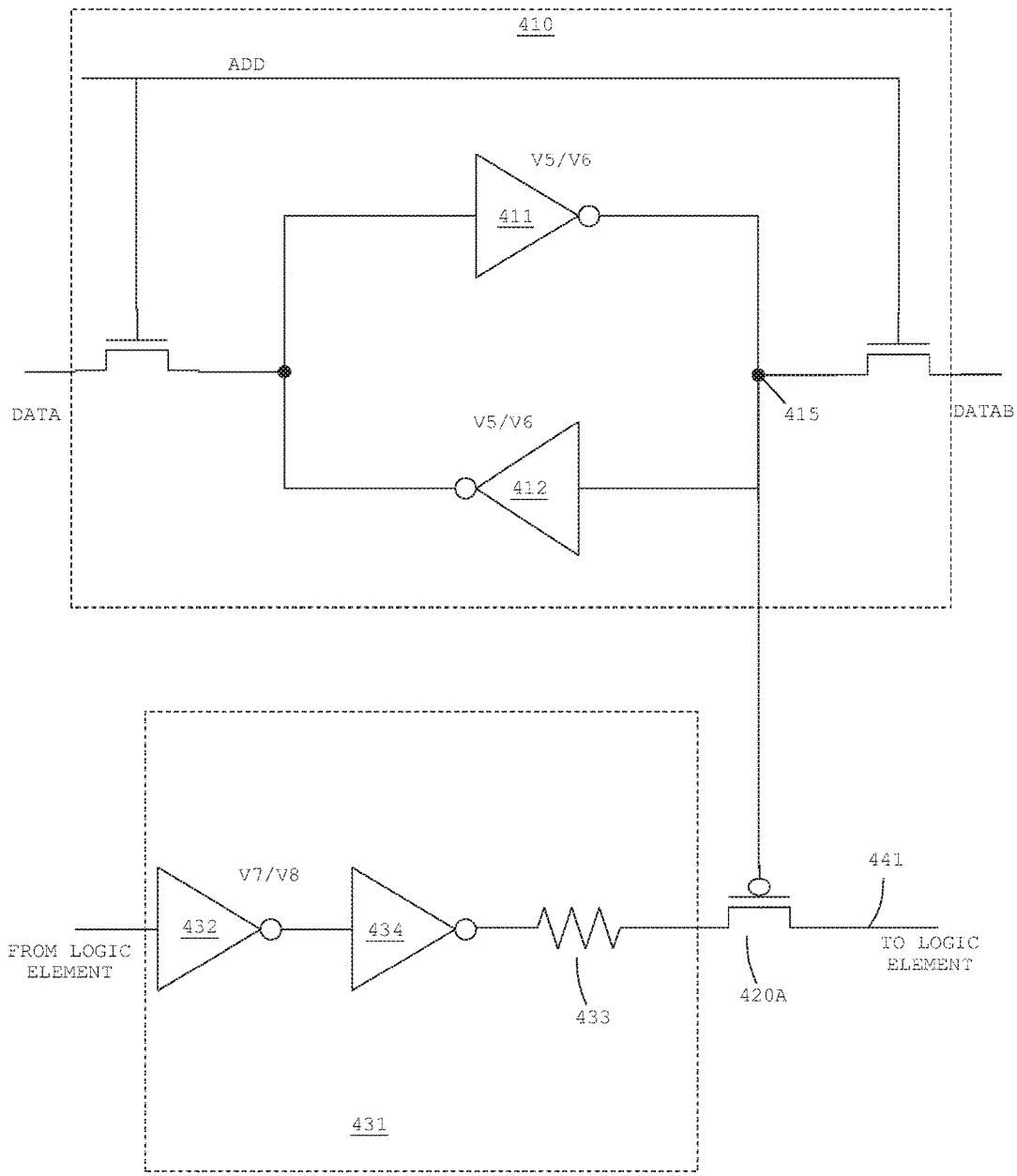
FIG. 4 shows a detailed implementation of an illustrative p-channel transistor pass gate circuit routing architecture in accordance with one embodiment of the present invention.

FIG. 4, meant to be illustrative and not limiting, illustrates a detailed implementation of p-channel transistor pass gate circuit routing architecture in accordance with one embodiment of the present invention. The p-channel transistor pass gate circuit routing architecture may be similar to n-channel transistor pass gate circuit routing architecture of FIG. 3; however the pass gate circuit includes a p-channel transistor instead of an n-channel transistor. When a p-channel pass gate is used, the negative voltage actually overdrives the p-channel transistor to help improved performance while the elevated voltage actually underdriven the p-channel transistor to help reduce leakage. In one embodiment, the details of memory cell 410 and routing interconnect 431 may be similar to memory cell 210 and routing interconnect 231 of FIG. 2. Therefore, these details will not be repeated.

Memory element 410 may be similar to memory element 210 of FIG. 2 (e.g., a SRAM element). However, each inverter 411 or 412 may be coupled to two power rails. The power rails may be at voltage V5 and voltage V6 within memory element 410. As an example, voltage V5 may be an overdriven voltage level, and voltage V6 may be an underdriven voltage level. In exemplary embodiments, the voltage levels V5 and V6 may be similar to or equal to voltage levels V2 and V1 (i.e., at −0.15 V and 0.9 V), respectively. Memory element 410 may supply one of these voltage levels V5 or V6 to a gate terminal of p-channel transistor pass gate circuit 420A through terminal 415.

Referring still to FIG. 4, routing interconnect 431 includes two inverters 432 and 434 and resistor 433. Routing interconnect 431 couples a logic element (e.g., logic element 130A or 230) to a source-drain terminal of p-channel transistor pass gate circuit 420A. A signal transmitted from the logic element may be transmitted through routing interconnect 431. A logic low signal may be at a voltage level V7 and a logic high signal may be at voltage level V8. In one embodiment, the voltage levels V7 and V8 may be 0 V and 0.75 V, respectively.

The signal supplied by logic circuitry 230 reaches the source-drain terminal of p-channel transistor pass gate circuit 420A. When p-channel transistor pass gate circuit 420A is activated by receiving an overdriven voltage at its gate terminal, the signal from interconnect 431 is allowed to be transmitted through p-channel transistor pass gate circuit 420A to routing interconnect 441. When p-channel transistor pass gate circuit 420A is deactivated by receiving an underdriven voltage at its gate terminal, the signal from interconnect 431 is blocked and not allowed to be transmitted through to routing interconnect 441.

In one embodiment, an integrated circuit device (as described in FIG. 1) may have a portion of routing interconnects that has only p-channel transistor pass gate circuits (e.g., p-channel transistor pass gate circuits 420A) and a portion of routing interconnects that has only n-channel transistor pass gate circuits (e.g., n-channel transistor pass gate circuits 220A of FIG. 2). A balanced number of p-channel transistor pass gate circuits and re-channel transistor pass gate circuits may generate a balanced manufacturing ratio between a p-type diffusion (to form a p-channel transistor) and an n-type diffusion (to form an n-channel transistor), which is advantageous to help attain design-for-manufacturing (DFM) in advanced process technologies.

In addition, having an equivalent number of re-channel transistor pass gate circuits and p-channel transistor pass gate circuits leads to an equivalent number of NWELLs and PWELLs (diffusion regions generally formed in a semiconductor device for respective n-channel transistors and p-channel transistors) associated with a memory cell (that includes at least one p-channel transistor and one n-channel transistor) to be maintained throughout the pass gate circuit region.

Figure 5:
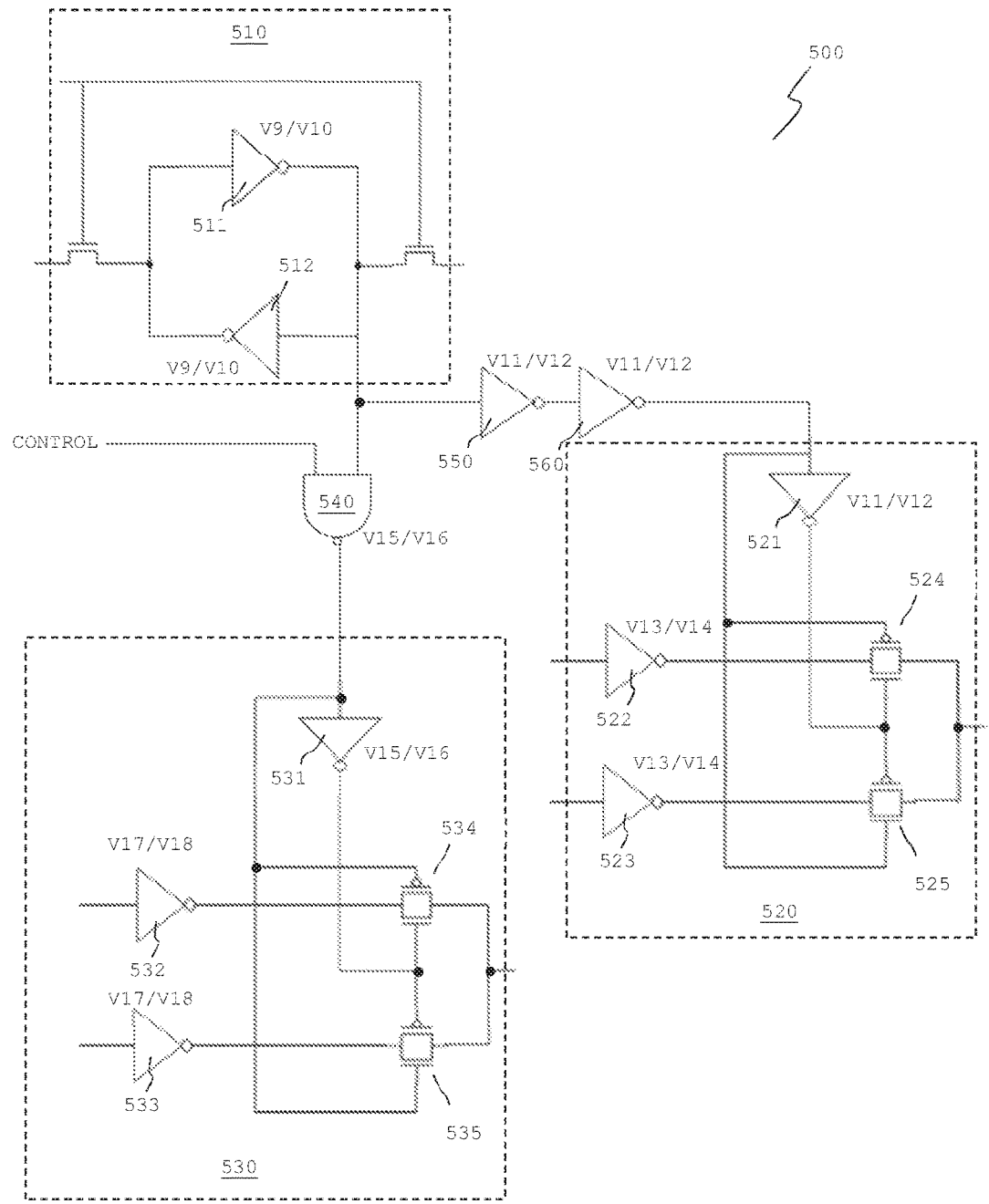
FIG. 5 shows an illustrative complementary metal oxide semiconductor (CMOS) transistors pass gate circuit routing architecture in accordance with one embodiment of the present invention.

FIG. 5, meant to be illustrative and not limiting, illustrates complementary metal oxide semiconductor transistors pass gate circuit routing architecture in accordance with one embodiment of the present invention. CMOS transistors pass gate circuit routing architecture 500 includes memory cell 510 and two-to-one multiplexers 520 and 530.

Memory cell 510 may be similar to memory cell 210 of FIG. 2 or memory cell 410 of FIG. 4, in one embodiment. Memory cell 510 may supply a voltage signal that is at voltage levels of V9 or V10, as shown by upper and lower power rails for inverters 511 and 512. In one embodiment, the voltage level V9 may be 0.9 V and voltage level V10 may be −0.15 V. The voltage levels V9 or V10 may be supplied to gate terminals of CMOS transistors pass gate circuit 524 and 525 (through inverters 550, 560 and 521) and to gate terminals of CMOS transistors pass gate circuit 534 and 535 (through NAND gate 540 and inverter 531).

As shown in the embodiment of FIG. 5, two-to-one multiplexer 520 includes inverters 521, 522 and 523 and CMOS transistors pass gate circuits 524 and 525. Two-to-one multiplexer 520 receives data signals through input terminals of inverters 522 and 523. One of the data signals may be transmitted using two-to-one multiplexer 520 through either CMOS transistors pass gate circuits 524 or 525. Each CMOS transistors pass gate circuits 524 and 525 include an n-channel transistor and a p-channel transistor. For the CMOS transistor pass gate circuit 524, the gate terminal of the n-channel transistor is coupled to an output terminal of the inverter 521 and the gate terminal of the p-channel transistor is coupled to an input terminal of the inverter 521. Similarly, for the CMOS transistor pass gate circuit 525, the gate terminal of the n-channel transistor is coupled to the input terminal of the inverter 521 and the gate terminal of the p-channel transistor is coupled to the output terminal of the inverter 521. The input terminal of inverter 521 is further coupled to memory cell 510 through inverters 550 and 560.

Referring still to FIG. 5, inverters 550, 560 and 521 may have power rails at voltage levels V11 and V12. In one embodiment, voltage levels V11 and V12 may be similar to voltage levels V9 and V10, respectively. For example, voltage levels V11 and V12 may be at 0.9 V and −0.15 V. Thus, voltage V11 may be an overdriven voltage level and voltage V12 may be an underdriven voltage level for re-channel pass gate circuits 524 and 525. In contrast, voltage V11 may be an underdrive voltage level and voltage V12 may be an overdriven voltage level for p-channel pass gate circuits 524 and 525. These voltage levels are supplied to the gate terminals of CMOS transistor pass gate circuits 524 and 525. Inverters 522 and 523 may have power rails at voltage levels V13 and V14. In one embodiment, voltage levels V13 and V14 may be at 0.85 V and 0 V, respectively. The voltage levels V11, V12, V13 and V14 at voltage levels 0.9 V, −0.15 V, 0.85 V and 0 V, respectively, may place the n-channel transistors and the p-channel transistors within CMOS transistor pass gate circuits 524 and 525 in a proper underdrive or overdrive conditions. Alternatively, voltage levels V13 and V14 may be similar to voltage levels V11 and V12.

Two-to-one multiplexer 530 includes inverters 531, 532 and 533 and CMOS transistor pass gate circuit 534 and 535. Inverters 531, 532 and 533 and CMOS transistor pass gate circuits 534 and 535 may have a similar arrangement as two-to-one multiplexer 520. As shown in the embodiment of FIG. 5, two-to-one multiplexer 530 receives data signals through input terminals of inverters 532 and 533. One of the data signals may be transmitted using two-to-one multiplexer 530 through either CMOS transistors pass gate circuits 534 or 535. Similar to CMOS transistors pass gate circuits 524 and 525, each CMOS transistors pass gate circuit 534 or 535 includes an n-channel transistor and a p-channel transistor. For the CMOS transistor pass gate circuit 534, the gate terminal of the n-channel transistor is coupled to an output terminal of the inverter 531 and the gate terminal of the p-channel transistor is coupled to an input terminal of the inverter 531. Similarly, for the CMOS transistor pass gate circuit 535, the gate terminal of the n-channel transistor is coupled to the input terminal of the inverter 531 and the gate terminal of the p-channel transistor is coupled to the output terminal of the inverter 531. The input terminal of inverter 531 is further coupled to memory cell 510 through NAND gate 540. In one embodiment, NAND gate 540 may have its power rails at voltage levels of V15 and V16.

Referring still to FIG. 5, inverter 531 may have power rails at voltage levels V15 and V16. In one embodiment, the voltage levels V15 and V16 may be similar or equal to the voltage levels V9 and V10, respectively. For example, the voltage levels V15 and V16 may be at 0.9 V and −0.15 V. These voltage levels are supplied to the gate terminals of CMOS transistors pass gate circuits 534 and 535. Inverters 532 and 533 may have power rails at the voltage levels V17 and V18. In one embodiment, the voltage levels V17 and V18 may be similar or equal to the voltage levels V13 and V14, respectively. For example, the voltage levels V17 and V18 may be at 0.85 V and 0 V, respectively. Similar to two-to-one multiplexer 520, the voltage levels V15, V16, V17 and V18 may be at 0.9 V, −0.15 V, 0.85 V and 0 V, respectively, and may place the n-channel transistors and the p-channel transistors within these CMOS transistors pass circuits 534 and 535 in a proper underdriven or overdriven conditions. In another embodiment, the voltage levels V17 and V18 may be similar or equal to the voltage levels V15 and V16, respectively.

Figure 6:
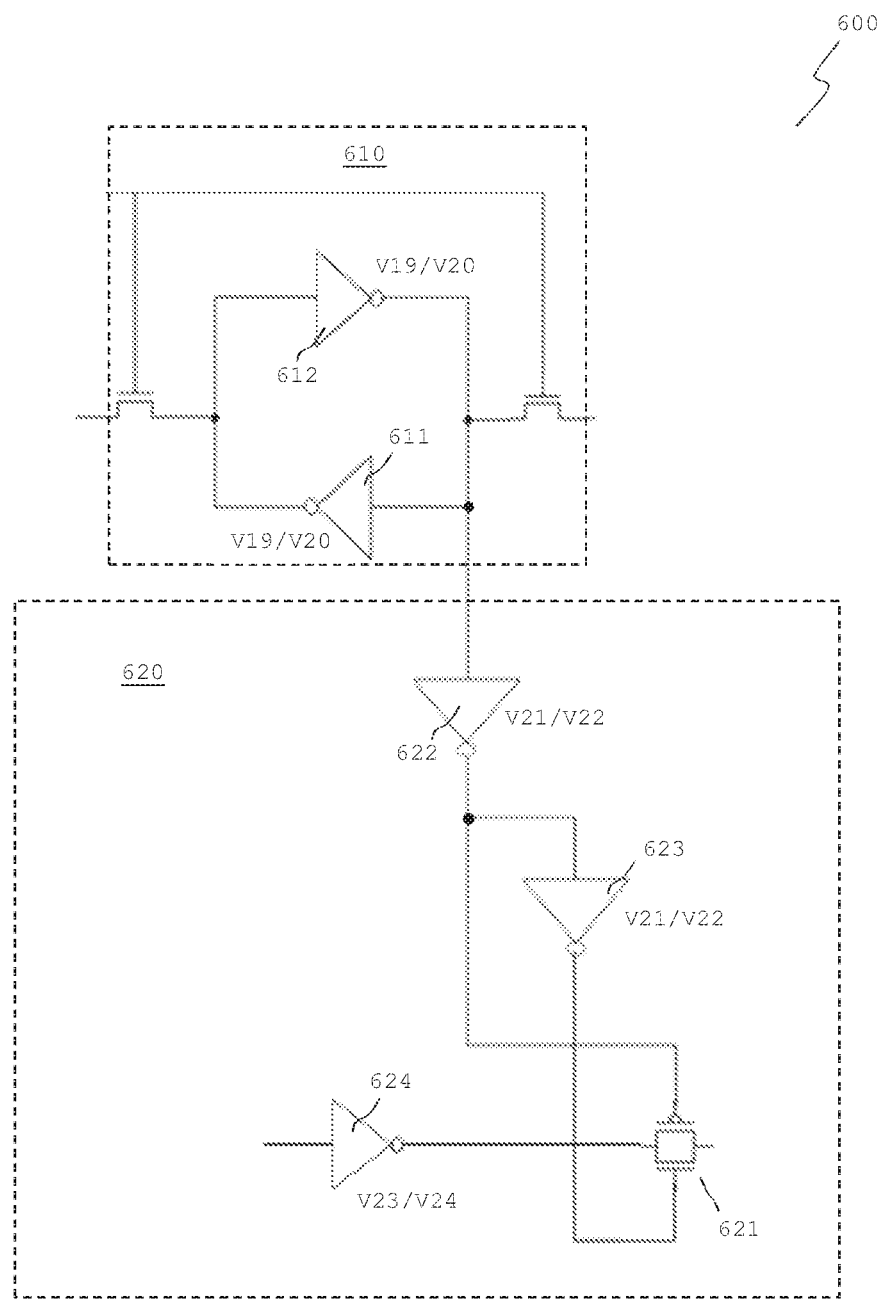
FIG. 6 shows another CMOS transistors pass gate circuit routing interconnects in accordance with one embodiment of the present invention.

FIG. 6, meant to be illustrative and not limiting, illustrates another CMOS transistor pass gate circuit routing interconnects in accordance with one embodiment of the present invention. CMOS transistors pass gate circuit routing interconnects 600 includes memory cell 610 and CMOS latch 620. Memory cell 610 may be similar to memory cell 210 of FIG. 2, memory cell 410 of FIG. 4 or memory cell 510 of FIG. 5, in various embodiments. Memory cell 610 may supply a voltage signal at voltage levels V19 or V20, as shown by the two voltage levels for inverters 611 and 612. In one exemplary embodiment, the voltage level V19 may be 0.9 V and voltage level V20 may be −0.15 V.

As shown in the embodiment of FIG. 6, memory cell 610 is coupled to CMOS latch 620. CMOS latch 620 includes CMOS transistors pass gate circuit 621 and inverters 622, 623 and 624. CMOS transistors pass gate circuit 621 includes a PMOS transistor and an NMOS transistor. A gate terminal of the NMOS transistor (forming part of CMOS transistors pass gate circuit 621) is coupled to output terminal of inverter 623. A gate terminal of the PMOS transistor (forming part of CMOS transistors pass gate circuit 621) is coupled to output terminal of inverter 622 and input terminal of inverter 623. A source-drain terminal of CMOS transistors pass gate circuit 621 is coupled to an output terminal of inverter 624. In one embodiment, the source-drain terminal of CMOS transistor pass gate circuit 621 receives a data signal transmitted through inverter 624.

Referring still to FIG. 6, inverters 622 and 623 may have power rails at voltage levels V21 and V22. In one embodiment, voltage level V21 and V22 may be similar to voltage levels V19 and V20 (e.g. 0.9 V and −0.15 V, respectively). Inverter 624 may have power rails at voltage levels V23 and V24. In one embodiment, voltage levels V23 and V24 may be at 0.85 V and 0 V, respectively. The voltage levels V21, V22, V23 and V24 at voltage levels 0.9 V, −0.15 V, 0.85 V and 0 V, respectively, may place n-channel transistors and p-channel transistor within these CMOS transistors pass gate circuit 621 in a proper underdrive condition or overdrive conditions. In another embodiment, voltage levels V21 and V22 may be similar to the voltage levels V23 and V24, respectively.

Figure 7:
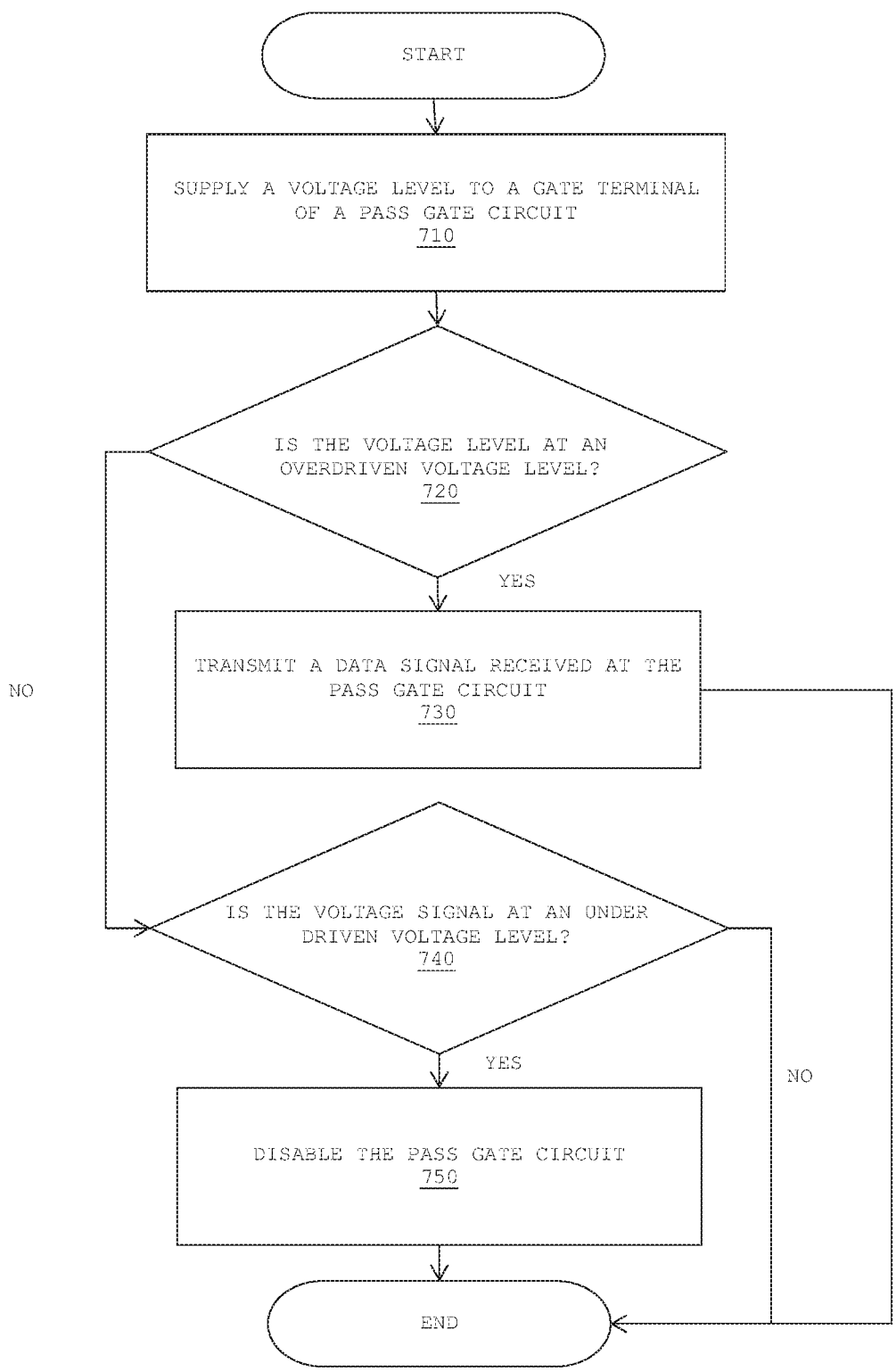
FIG. 7 shows a flowchart on an illustrative method of operating a pass gate circuit in accordance with one embodiment of the present invention.

FIG. 7, meant to be illustrative and not limiting, illustrates a flowchart on a method of operating a pass gate circuit in accordance with one embodiment of the present invention. The pass gate circuit may be an n-channel transistor pass gate circuit (e.g., pass gate circuit 220A of FIG. 2), a p-channel transistor pass gate circuit (e.g., pass gate circuit 420A of FIG. 4) or a CMOS transistors pass gate circuit (e.g., CMOS transistors pass gate circuits 524, 524, 534 and 535 of FIG. 5 or CMOS transistors pass gate circuit 621 of FIG. 6).

At step 710, a voltage level is supplied to a gate terminal of the pass gate circuit. In one embodiment, the voltage level is supplied by a memory element. The memory element may be similar to memory cell 210 of FIGS. 2 and 3, memory cell 410 of FIG. 4, memory cell 510 of FIG. 5 or memory cell 610 of FIG. 6. The voltage level may be at a high voltage level (i.e., logic '1') or a low voltage level (i.e., a logic '0'). The high voltage level may be at the voltage level 0.9 V whereas the low voltage level may be at the voltage level −0.15 V, in one exemplary embodiment. The high voltage level may also be referred to as an overdriven voltage level for the pass gate circuit. In contrast, the low voltage level may be referred to as underdriven voltage for the pass gate circuit.

At step 720, determine whether the voltage level is at an overdriven voltage level. If the voltage level of the voltage signal is at the overdriven voltage level, method proceeds to step 730. In addition to that, supplying an overdriven voltage level at the gate terminal of the pass gate circuit may place the pass gate circuit into an overdrive condition. Alternatively, if the voltage level of the voltage signal is not at overdriven voltage level, the method may proceed to step 740.

At step 730, a data signal is transmitted through the pass gate circuit from its source-drain terminal. The data signal may be received from logic elements (e.g., logic elements 230 or 240 of FIG. 2) in the logic circuitry. The data signal may be transmitted through multiple inverters (e.g., inverters 332 and 331 of FIG. 3). The data signal may be at a different voltage level than the overdriven or underdriven voltage level. In one exemplary embodiment, the data signal may be at a voltage level of 0.85 V or a 0 V. Subsequent to step 730, the method of FIG. 7 ends.

However, if the method proceeds to step 740, then it is determined whether a voltage level of the voltage signal is at an underdriven voltage level at step 740. If the voltage level of the voltage signal is at the underdriven voltage level, the method proceeds to step 750. In addition to that, supplying an underdriven voltage level at the gate terminal of the pass gate circuit may place the pass gate circuit into an underdriven condition.

At step 750, the data signal is blocked from being transmitted through the pass gate circuit. In fact, as a result of the pass gate circuit being placed in the underdriven condition, current leakages through the pass gate circuit are significantly reduced.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IC circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit, comprising:
a pass gate circuit that receives a user signal that toggles between a high voltage level and a low voltage level;
a memory element that outputs a control signal to control the pass gate circuit, wherein the memory element comprises at least two cross-coupled inverters, wherein the control signal is asserted to be greater than the high voltage level when activating the pass gate circuit, wherein the control signal is deasserted to be less than the low voltage level when deactivating the pass gate circuit; and
a driver circuit that receives the control signal and drives the control signal onto the pass gate, wherein the driver circuit is powered by voltage levels different than the high and low voltage levels.

2. The integrated circuit as defined in claim 1, wherein the control signal is at least one transistor threshold voltage greater than the high voltage level when activating the pass gate circuit.

3. The integrated circuit as defined in claim 1, wherein the control signal is at least one transistor threshold voltage lower than the low voltage level when deactivating the pass gate circuit.

4. The integrated circuit as defined in claim 1, wherein the pass gate circuit comprises an n-channel transistor.

5. The integrated circuit as defined in claim 4, wherein the pass gate circuit further comprises a p-channel transistor coupled in parallel to the n-channel transistor.

6. The integrated circuit as defined in claim 5, wherein the n-channel transistor has a gate terminal that receives the control signal, and where the p-channel transistor has a gate terminal that receives an inverted version of the control signal.

7. The integrated circuit as defined in claim 4, wherein the n-channel transistor has a threshold voltage that is lower than a standard threshold voltage.

8. The integrated circuit as defined in claim 1, wherein the memory element comprises a volatile memory cell with power rails, wherein a first of the power rails is biased at a voltage level greater than the high voltage level and wherein a second of the power rails is biased at a voltage level less than the low voltage level.

9. The integrated circuit as defined in claim 1, further comprising:
   an additional pass gate circuit that receives another user signal that toggles between the high voltage level and the low voltage level, wherein the additional pass gate circuit is a p-channel transistor; and
   an additional memory element that outputs another control signal to control the additional pass gate circuit, wherein the another control signal is asserted to be less than the low voltage level when activating the pass gate circuit, and wherein the another control signal is deasserted to be greater than the high voltage level when deactivating the pass gate circuit.

10. An integrated circuit, comprising:
    a memory element that outputs a control signal that toggles between first and second voltage levels;
    a pass gate circuit having a gate terminal that receives the control signal, wherein the pass gate circuit transmits a user signal that toggles between third and fourth voltage levels, wherein the third and fourth voltage levels are within a voltage range between the first and second voltage levels, and wherein a voltage difference between the third and fourth voltage levels is less than a voltage difference between the first and second voltage levels; and
    a driver circuit coupled between the memory element and the gate terminal of the pass gate circuit, wherein the driver circuit comprises at least one inverter.

11. The integrated circuit as defined in claim 10, wherein the voltage difference between the first and second voltage levels is a predetermined maximum voltage difference across source-drain terminals of a transistor.

12. The integrated circuit as defined in claim 10, further comprising:
    an additional memory element that outputs a control signal that toggles between the third and fourth voltage levels; and
    an additional pass gate circuit that receives the control signal and transmits another user signal that toggles between the third and fourth voltage levels.

13. The integrated circuit as defined in claim 10, wherein the voltage difference between the first and third voltage level is less than a transistor threshold voltage, and wherein the voltage difference between the second and fourth voltage level is less than the transistor threshold voltage.

14. The integrated circuit as defined in claim 10, wherein the first voltage level is greater than the third voltage level, and wherein the second voltage level is less than the fourth voltage level.

15. The integrated circuit as defined in claim 10, wherein the pass gate circuit comprises a circuit selected from the group consisting of: a p-channel metal oxide semiconductor (PMOS) transistor and a Fin field effect transistor (FinFET).

16. The integrated circuit as defined in claim 10, wherein the first voltage level is 0.9 V, the second voltage level is −0.15 V, the third voltage level is 0.7 V and the fourth voltage level is 0 V.

17. The integrated circuit of claim 10, wherein the driver circuit is powered at the third and fourth voltage levels.

18. The integrated circuit of claim 1, wherein the driver circuit comprises at least one inverter.

19. The integrated circuit of claim 1, wherein the driver circuit comprises at least two inverters coupled in series.

20. The integrated circuit of claim 1, wherein the driver circuit comprises a logic NAND gate that receives the control signal from the memory element and an additional control signal.

* * * * *